US012712527B1

(12) United States Patent
Gupta

(10) Patent No.: US 12,712,527 B1
(45) Date of Patent: Aug. 18, 2026

(54) ACCURATE DELAY GENERATOR AND ACCURATE OSCILLATOR

(71) Applicant: Milind Chandra Gupta, San Jose, CA (US)

(72) Inventor: Milind Chandra Gupta, San Jose, CA (US)

( * ) Notice: Subject to any disclaimer, the term of this patent is extended or adjusted under 35 U.S.C. 154(b) by 0 days.

(21) Appl. No.: 19/058,325

(22) Filed: Feb. 20, 2025

(51) Int. Cl.
*H03K 3/011* (2006.01)
*H03K 3/0231* (2006.01)

(52) U.S. Cl.
CPC .......... *H03K 3/011* (2013.01); *H03K 3/0231* (2013.01)

(58) Field of Classification Search
CPC .......................... H03K 3/011; H03K 3/0231
See application file for complete search history.

(56) References Cited

U.S. PATENT DOCUMENTS

| | | | | |
|---|---|---|---|---|
| 9,356,554 | B2 * | 5/2016 | Tam | H03B 5/24 |
| 11,831,276 | B1 * | 11/2023 | Gonapati | H03B 5/24 |
| 2010/0164638 | A1 * | 7/2010 | Saw | H03K 3/0231 331/111 |

* cited by examiner

*Primary Examiner* — Jeffrey M Shin

(57) ABSTRACT

A delay circuit comprising self calibrating means. The process, supply and temperature dependent error of intrinsic delay of a comparator in a delay circuit is self calibrated out of the generated delay. The intrinsic delay is used to self adjust the delay generating reference to remove effect of the intrinsic delay during delay generation. A relaxation oscillator circuit comprising the delay circuit blocks to create a process, supply and temperature independent oscillation frequency.

13 Claims, 5 Drawing Sheets

ACCURATE DELAY GENERATOR AND ACCURATE OSCILLATOR

BACKGROUND OF THE INVENTION

Delay circuits are typically used to create timing circuits to measure or create timing intervals that can be used to produce delays for signal processing circuits or create oscillators or used as timing measurement references.

There are many ways to generate delays in electronic circuits. For example, a RC circuit followed by some form of a comparator may be used to delay an input signal. Additionally, a digital clock and a counter may also be used to generate a delay, which are useful when long delays are required since a corresponding RC delay circuit has drawbacks such as larger area occupation and difficulty of control.

While in other examples, small delays may be generated by utilizing the propagation delay of logic gates. These types of delays can give very small delays and a good resolution of controlling the delay by cascading logic gates. However, these delays may be varied due to process variations, temperature changes and supply voltage changes. The variation can be as large as 200%.

To improve the accuracy of delays, the circuit may include a constant current charging a capacitor to control the timing signal and a comparator to accurately detect the timing event crossover. The comparator compares the capacitor voltage to a constant trimmed reference. When the voltage of the capacitor crosses the reference voltage, the comparator signals the end of the delay. In addition, the current source is usually trimmed to remove the process variation of the capacitor. This delay can then be used to create oscillators and then also be used to generate larger delays using digital counters. The only substantial error source in this configuration is the intrinsic delay of the comparator itself. The delay of the comparator behaves like logic delay, which means it is highly variable and changes with process, temperature and supply voltage. Hence, the comparator delay has to be much smaller than the overall delay required so as to reduce the error due to the comparator delay.

The delay circuit as described above makes the comparator design especially challenging when very small accurate delays are required. For example, to generate an accurate delay of 50 ns, a comparator delay should be selected at least less than 10 ns. As a result, the reference voltage would need to be adjusted to absorb the extra 10 ns being generated by the comparator which constitutes about 20% of the delay. And then, when the comparator delay of 10 ns becomes high (such as 15 ns), which can easily happen due to a process, temperature and/or supply voltage change scenario we already get an error of 10% or more in the generated delay. In addition, making comparators faster with less propagation delay requires increasingly more current and area. More area of the circuit will keep the offset voltages small compared to the reference voltage and because of larger areas more current is required to make the comparator respond faster.

SUMMARY OF THE INVENTION

A delay circuit according to an embodiment of the present invention comprises a comparator based delay generator circuit to generate a process, supply and temperature independent delay; a first signal ramp with a controlled rate of change to generate the delay; a second signal ramp with a negative rate of change of the first signal ramp to calibrate the delay circuit; a predetermined reference signal to set the generated delay; and a signal hold method to hold the second signal ramp value at the given comparator state change. During the calibration mode the hold signal level is substantially in accordance with the following relationship to the predetermined reference, the comparator propagation delay $T_{PD}$ and the first signal ramp slope S:

$$\mathrm{HOLD\_SIGNAL} = \mathrm{REFERENCE} - T_{PD}S$$

The parameter $T_{PD}$ is a process, supply and temperature dependent parameter.

The hold signal is subsequently used to compare against the first signal ramp to generate the desired circuit delay. The delay is substantially in accordance with the following relationship:

$$\mathrm{DELAY} = \int_{Tstart}^{Tsc} \frac{\mathrm{REFERENCE} - \mathrm{RAMP\_START}}{S} dt$$

wherein the RAMP_START is the signal level of the first signal ramp at the initiation of the delay. The DELAY relationship eliminates any process, supply and temperature dependence due to the comparator delay $T_{PD}$ parameter.

A relaxation oscillator circuit according to another embodiment of the present invention comprises two comparator based delay circuits each with a first signal ramp with a controlled rate of change to generate a portion of the oscillation time period; a second signal ramp with a negative rate of change of the first signal ramp to calibrate each delay circuit; a predetermined reference signal to control the timing in each delay circuit; and a signal hold method to hold the second signal ramp value at the given comparator state change.

Each delay circuit generates a certain delay and subsequently triggers the next delay circuit. With two such delay circuits the oscillation frequency is substantially in accordance with the following relationship:

$$\mathrm{FREQUENCY} = \frac{1}{\mathrm{DELAY}_1 + \mathrm{DELAY}_2}$$

DETAILED DESCRIPTION OF THE INVENTION

Figure 1A:
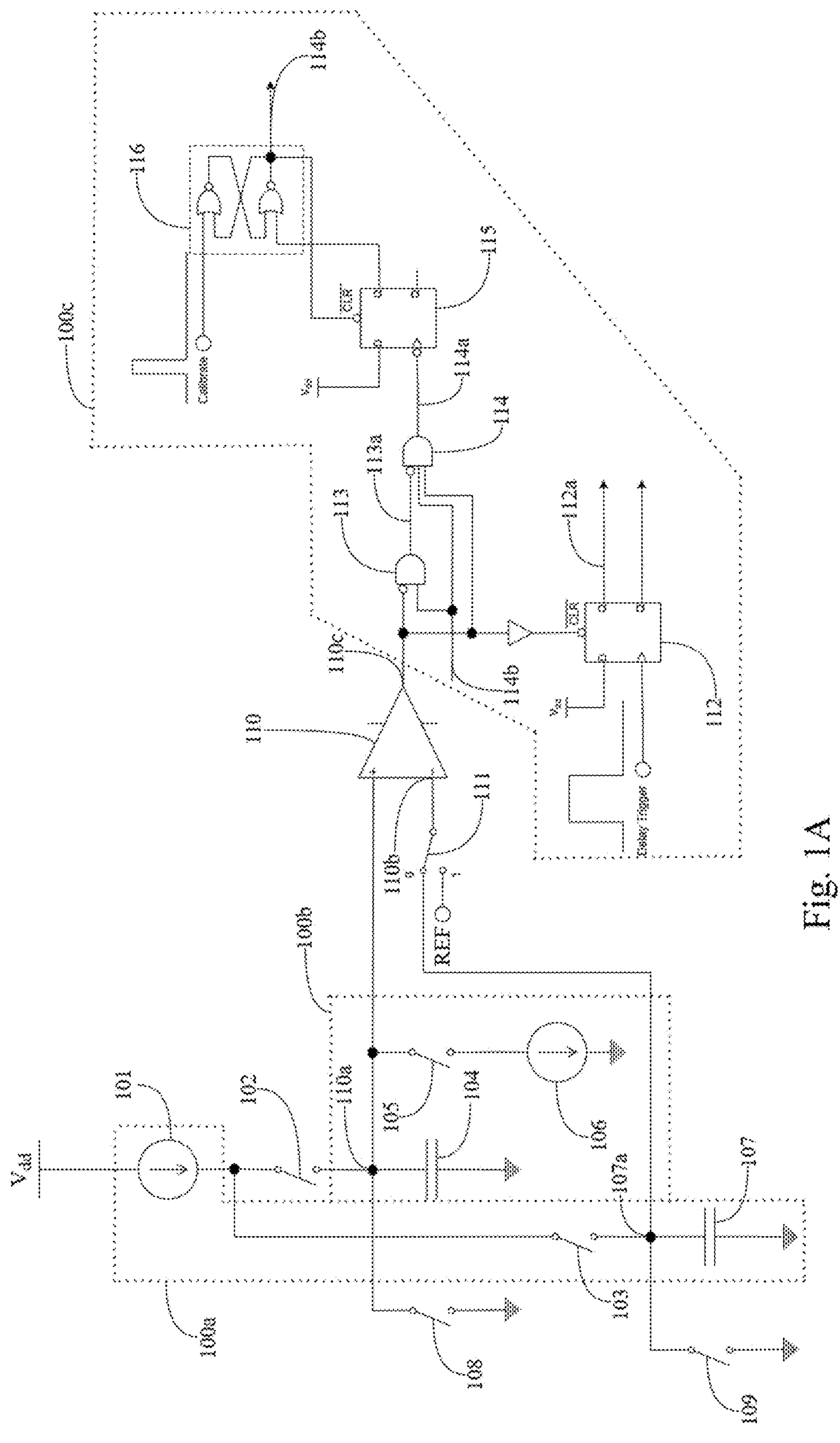
FIG. 1A shows the schematic diagram of a delay circuit in accordance with embodiments of the present disclosure

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

As used herein, the term "and/or" includes any and all combinations of one or more of the associated listed items.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein specify the presence of stated features, elements, and/or components, but do not preclude the presence or addition of one or more other features, elements, components, and/or groups thereof. The indefinite articles and the definite articles shall encompass both the plural and singular unless the opposite is clearly apparent from the context.

Throughout the drawings and the detailed description, the same reference numerals refer to the same elements. The drawings may not be to scale, and the relative size, proportions, and depiction of elements in the drawings may be exaggerated for clarity, illustration, and convenience.

This description and the figures constitute a disclosure of example embodiments and applications that illustrate various features and advantages of the delay circuit according to an embodiment. Delay circuits are widely used to adjust the timing of a signal by delaying the signal by a certain time delay. For example, complementary metal oxide semiconductor (CMOS) delay circuits are often used in time-based circuits. However, the time delay of CMOS delay circuits can be quite sensitive to Process, Voltage and Temperature (PVT) variations. In view of the disadvantages of the delay circuit described above, the present disclosure discloses a delay circuit which can generate a delay time independent of the comparator delay PVT variations. Hence, the delay time generated by the delay circuit would be less sensitive to process variations, temperature changes and supply voltage changes, which can address the above various disadvantages.

FIG. 1A shows a schematic diagram of an example delay circuit according to an embodiment. The circuit includes a comparator 110, a first signal ramp generation method 100*a*, a predetermined reference REF to generate the delay, a second signal ramp generation method 100*b*, a method to hold the second signal ramp level 104, 102, 105, a logic circuit 100*c* to generate the control signals.

The first signal ramp generation method consist of a current source 101, a capacitor 107, and a control switch 103. The ramp is reset by the switch 109. The ramp voltage is sensed directly on node 107*a*. The second signal ramp generation method consist of a current sink 106, a capacitor 104, and a control switch 105. The ramp is initiated by the control switch 102 which allows the starting point of the ramp to be above the predetermined reference REF. The capacitor 104 is also used as a signal hold method for the second signal ramp level. The hold signal is sensed directly on node 110*a* and is coupled to the comparator 110 second input terminal. Switch 108 is used to reset the hold voltage on capacitor 104 and calibrate the delay.

The control switch 111 selects which signal is coupled to the comparator 110 first input terminal. The comparator compares the signal between its first input terminal 110*b* and second input terminal 110*a* and changes its output 110*c* when the signals crossover.

The logic circuit 100*c* generates all the control signals for controlling all the control switches during the calibration phase and the delay phase. The logic circuit example consists of a RS-Latch 116, 2 D flip flops 112, 115 and logic gates 113 and 114.

Figure 1B:
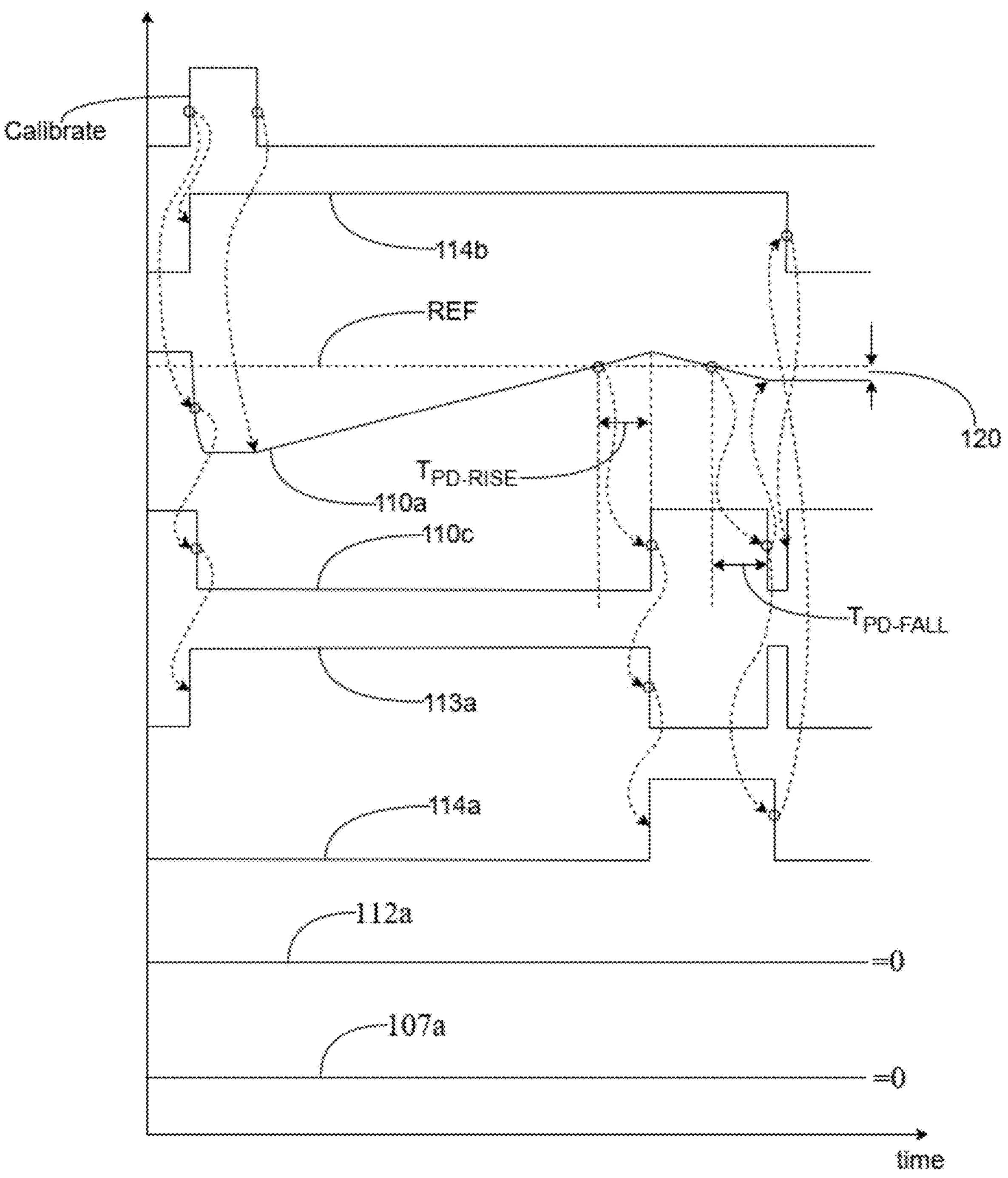
FIG. 1B shows the timing diagram during the calibration phase of the delay circuit in FIG. 1A.

FIG. 1B shows the waveforms of the calibration phase of the circuit in FIG. 1A. The calibration phase is started by the Calibrate pulse seen in the first strip of the waveforms of FIG. 1B. The Calibrate pulse sets the output 114*b* of the RS-Latch 116 as seen in the second strip and turns ON switch 108 to reset the hold voltage 110*a* as seen in the third strip. The output of the RS-Latch 114*b* sets the control switch 111 in position 1 directly coupling the REF node to the first input of the comparator 110. The resetting of the hold voltage 110*a* makes the voltage go below REF causing the output 110*c*, of the comparator 110, to go low as seen in the fourth strip. A low output 110*c*, from the comparator 110, makes the output 113*a* of the gate 113 to go high. Node 113*a* controls switch 102 to turn ON.

Once the Calibrate pulse goes low, switch 108 is released causing capacitor 104 to start charging due to current source 101. Node 110*a* voltage starts increasing in a linear ramp as seen in the third strip. When the signal 110*a* exceeds the REF signal, the output 110*c*, of the comparator 110, transitions to a high state. The transition happens after an intrinsic delay of TPD-RISE, as shown in the fourth strip. The comparator output 110*c* going high causes the output 113*a* of gate 113 to go low which turns OFF switch 102. With 113*a* low output 114*a* of gate 114 goes high. This can be seen in the fifth and sixth strips of the waveforms in FIG. 1B. Node 114*a* controls switch 105 to turn ON.

When 105 turns ON the capacitor 104 starts discharging from the current sink 106 at a rate which is negative to the rate at which it was charging before. This is the second signal ramp that is used to calibrate the delay circuit. When REF exceeds signal 110*a*, the comparator output transitions back to the low state. The transition happens after an intrinsic delay of TPD-FALL, as shown in the fourth strip. A low output 110*c* makes the output 113*a* of gate 113 go high and the output 114*a* of gate 114 go low. Node 114*a* controls switch 105 to turn OFF and the voltage on capacitor 104 is held at a fixed value substantially in accordance with the following relationship:

$$\text{HOLD\_SIGNAL} = \text{REFERENCE} - T_{PD}S$$

HOLD_SIGNAL represents the voltage at node 110*a* during the hold phase, REFERENCE is the voltage of the REF node, TPD here represents the TPD-FALL propagation delay of the comparator 110, and S is the slope of the signal which is the ratio of the current 106 to the value of the capacitor 104.

Note that there is a delta difference 120 between the REFERENCE and the HOLD_SIGNAL shown in FIG. 1B. The difference 120 is equal to TPDS, which helps create the calibrated reference that can be used repeatedly to generate an accurate delay.

Node 114*a* going low clocks the flip flop 115 to reset the R-S Latch 116, causing node 114*b* to go low. Node 114*b* going low controls switch 111 to couple node 107*a* to the comparator first input. Node 107*a* is held at a low voltage because of switch 109 which is controlled by the complement of node 112*a*. This causes the output 110*c* of the comparator 110 to go high, which can be seen in the fourth strip of the waveforms in FIG. 1B. This marks the end of the calibration phase.

Figure 1C:
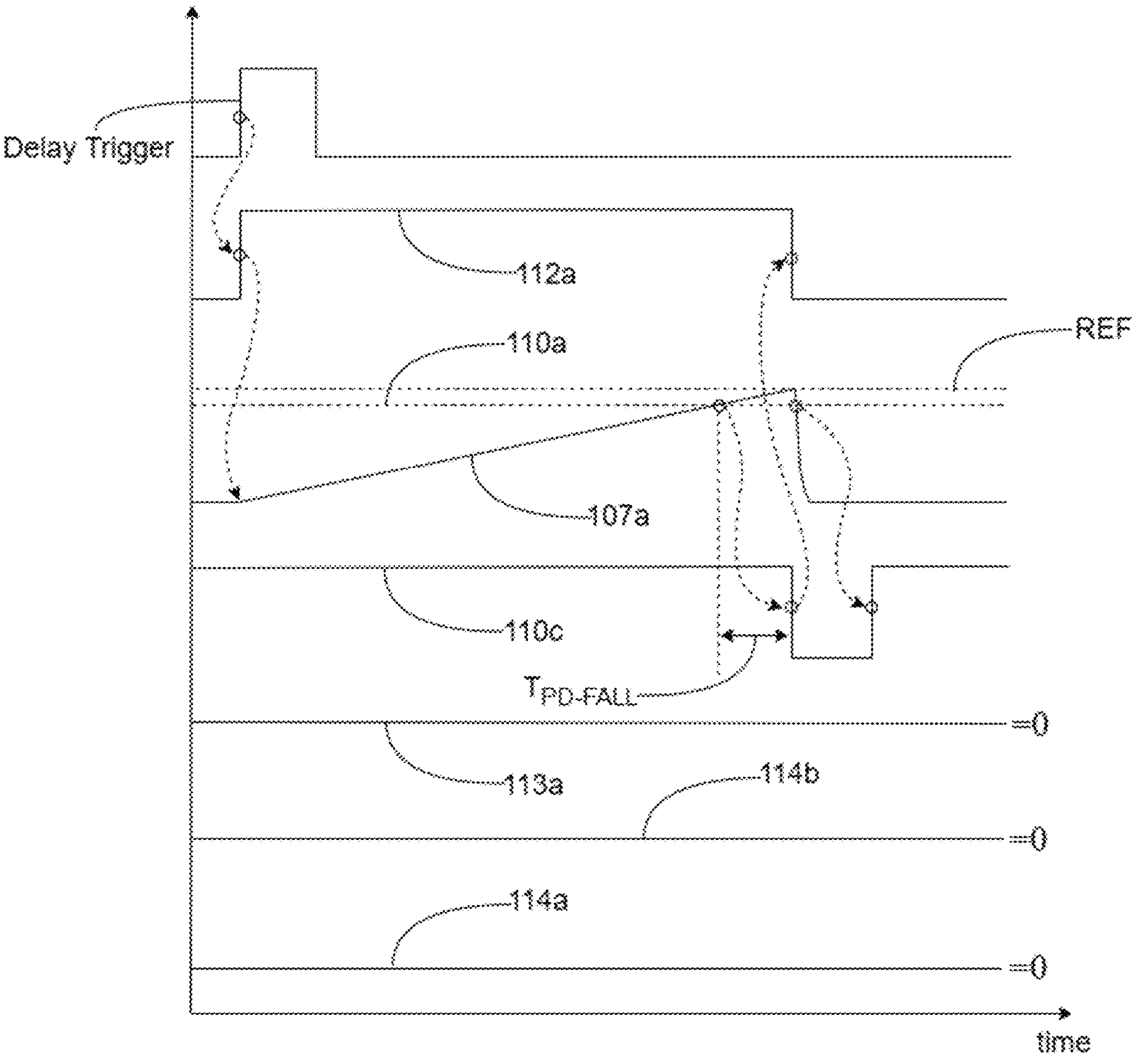
FIG. 1C shows the timing diagram during the delay generation phase of the delay circuit in FIG. 1A.

After the circuit in FIG. 1A is calibrated, it can be used to generate an accurate delay in the delay phase of the circuit. FIG. 1C shows the waveforms of the delay phase of the circuit in FIG. 1A. The delay phase is started by the Delay Trigger pulse seen in the first strip of the waveforms in FIG. 1C.

The Delay Trigger pulse sets the output 112*a* high of the flip flop 112. This can be seen in the second strip of the waveforms in FIG. 1C. Node 112*a* controls both switches 103 and 109 in a complementary fashion, releasing 109 and turning ON 103. Capacitor 107 starts charging due to current source 101 and node 107*a* voltage starts increasing in a linear ramp which is used as the first signal ramp. The first signal ramp voltage on node 107*a* can be seen in the third strip of the waveforms in FIG. 1C. During this time the output 110*c* of comparator 110 is high as we saw at the end of the calibration phase.

When the first signal ramp 107*a* exceeds the HOLD_SIGNAL 110*a*, the output 110*c* of the comparator 110 transitions to the low state after the intrinsic delay TPD-FALL. This is seen in the fourth strip of the waveforms in FIG. 1C. Node 110*c* going low resets the flip flop 112 and its output 112*a*. Node 112*a* going low controls the switch 103 to turn OFF and switch 109 to turn ON. The turn ON of switch 109 discharges the capacitor 107 to a low voltage and makes the output 110*c* of the comparator 110 to go back up high. This can be seen in the third and fourth strips of the waveforms in FIG. 1C. This also marks the end of the delay phase with the delay generated as the pulse width of signal 112*a*. The pulse width of signal 112*a* is substantially in accordance with the relationship:

$$\text{DELAY} = \frac{\text{HOLD\_SIGNAL}}{S} + T_{PD} = \frac{\text{REFERENCE}}{S}$$

Here we see that the DELAY generated is independent of the process, supply and temperature dependent parameter TPD.

Signals 113*a*, 114*a* and 114*b* all remain in the low state during the delay phase. These signals are only activated during a calibration phase. In normal operation a calibration phase can follow a delay phase. In another example the calibration phase may be done once and then multiple delay phases can be activated. In another example of the embodiment the calibration phase may be started simultaneously with the delay phase where the second signal ramp can be already higher than REF to start off with the comparator output high. This can be done easily if the calibration time is smaller than the required delay the circuit has to generate.

Figure 2A:
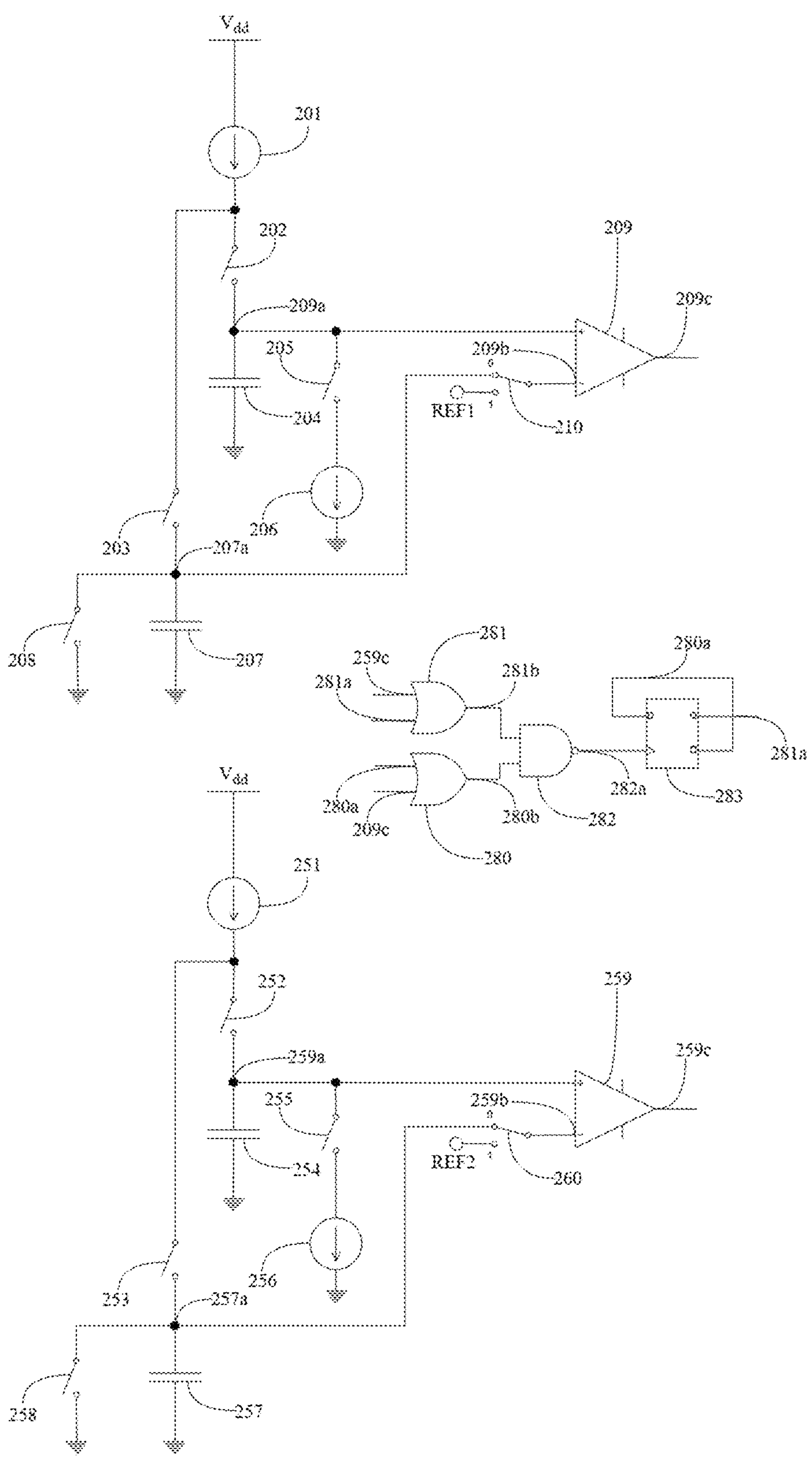
FIG. 2A shows the schematic diagram of a relaxation oscillator circuit in accordance with embodiments of the present disclosure

FIG. 2A shows a schematic diagram of an example relaxation oscillator circuit according to an embodiment. The relaxation oscillator circuit according to the example includes a first delay circuit (200-210) and a second delay circuit (250-260). In one example, the first delay circuit and the second delay circuit have the same configuration as described in reference to FIG. 1A.

By means of the circuit arrangement of the delay circuit shown in FIG. 1A, a delay time generated by the first delay circuit and the second delay circuit is independent of the comparator delay. In this example the delay generated by the first delay circuit is substantially in accordance with the following relationship:

$$\text{DELAY}_1 = \frac{\text{REFERENCE1}}{S1}$$

REFERENCE1 represents the REF1 node voltage and S1 represents the slope of the first signal ramp created by the current 201 and capacitor 207. The magnitude of S1 in this example is the ratio of current 201 to the value of capacitor 207.

The delay generated by the second delay circuit is substantially in accordance with the following relationship:

$$DELAY_2 = \frac{\text{REFERENCE2}}{S2}$$

REFERENCE2 represents the REF2 node voltage and S2 represents the slope of the first signal ramp created by the current 251 and capacitor 257. The magnitude of S2 in this example is the ratio of current 251 to the value of capacitor 257.

Figure 2B:
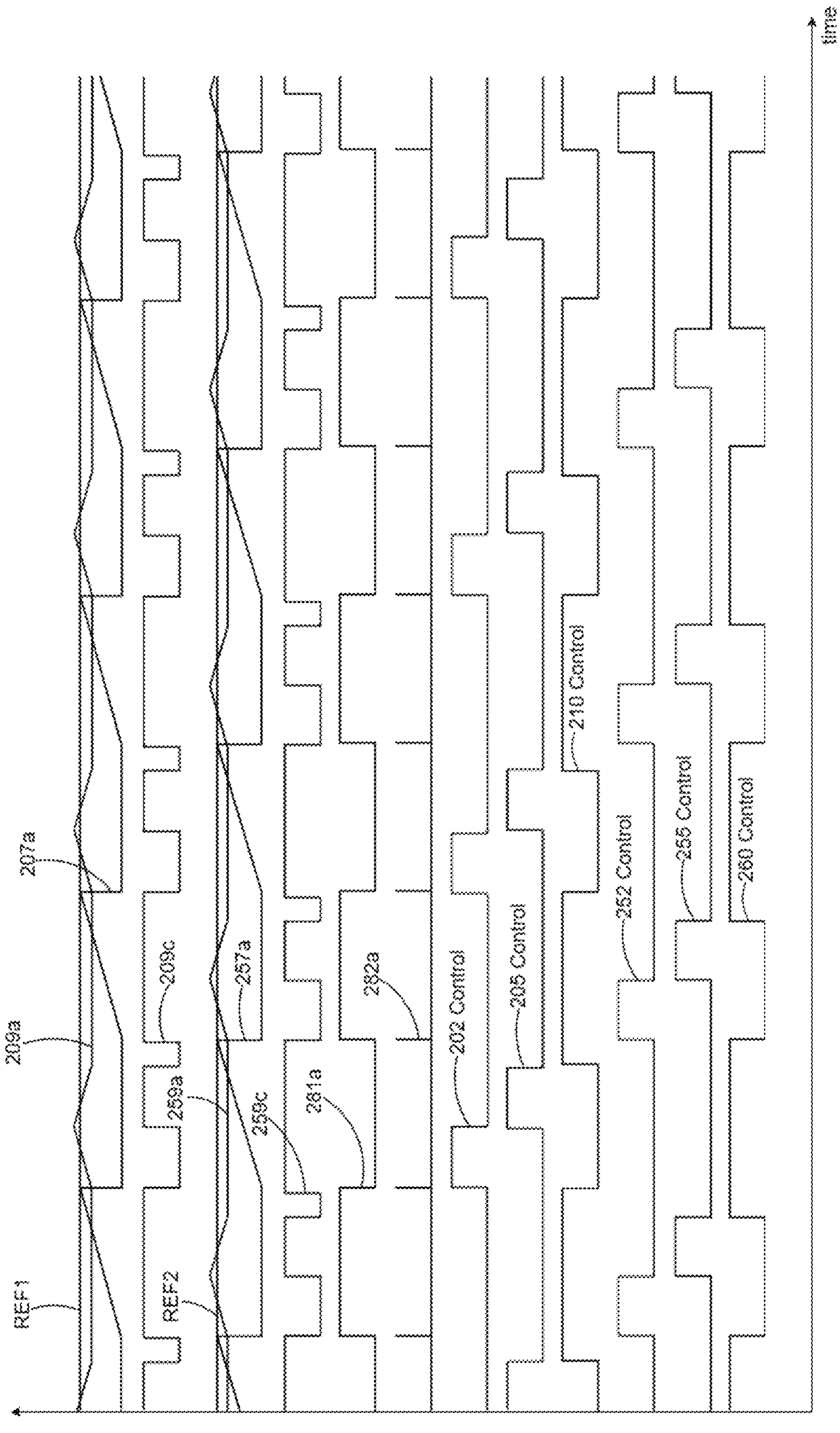
FIG. 2B shows the timing diagram of the oscillator circuit in FIG. 2A

FIG. 2B shows the waveforms of operation of the oscillator circuit. The waveforms are similar to those of FIG. 1C and FIG. 1B the difference being that the delay phase is followed immediately by a calibration phase. Another difference is that the calibration phase starts from the HOLD_SIGNAL level rather than a low voltage on the hold capacitor 204, 254.

The first strip in FIG. 2B shows the REF1 node, the first signal ramp 207*a*, and the second signal ramp and hold signal 209*a* for the first delay circuit. At every alternate cycle the first signal ramp 207*a* ramps up and when it exceeds the HOLD_SIGNAL 209*a* the output 209*c* of the comparator 209 goes low after some delay TPD. This is seen in the second strip of the waveforms of FIG. 2B. As soon as the output 209*c* goes low the second delay circuit is activated by the D Flip Flop 283 which is connected in toggle configuration. This causes the first signal ramp 257*a* of the second delay circuit to start ramping up. The output 209*c* of the comparator going low additionally switches the first delay circuit in the calibration phase.

In the calibration phase the first delay circuit controls switch 210 to couple REF1 directly to the first input of comparator 209, at the same time turning ON switch 202. Node 209*a* exceeds REF1 causing the output 209*c* to change state to low and turn OFF switch 202 and turn ON switch 205. This causes the current 206 to discharge capacitor 204 with a second signal ramp until it reduces below REF1 and the output 209*c* changes state to low again turning OFF switch 205. This creates the calibrated HOLD_SIGNAL on the capacitor 204, ready for the next cycle delay generation. This calibration ramp 209*a* is seen in the first strip of the waveforms in FIG. 2B.

The same calibration process is followed by the second delay circuit after its delay phase and can be seen in the third and fourth strip of the waveforms in FIG. 2B.

The fifth strip in the waveforms in FIG. 2B shows the output 281*a* of the flip flop 283. The output 281*a* toggles every cycle thus activating the two delay circuits alternately.

The duty ratio of this signal is substantially in accordance with the following relationship:

$$DUTY\_RATIO = \frac{DELAY_1}{DELAY_1 + DELAY_2}$$

DELAY1 and DELAY2 being the delays generated by the 2 delay circuits. The DUTY ratio can be controlled very accurately with no dependence on the process, supply and temperature dependent delay of the comparator.

The frequency of the output 281*a* is substantially in accordance with the following relationship:

$$FREQUENCY = \frac{1}{DELAY_1 + DELAY_2}$$

The sixth strip in the waveforms in FIG. 2B shows the clock signal used to trigger the flip flop 283. The clock triggers every cycle and hence the frequency can be set to be double of the frequency of output 281*a* if both delay circuits generate the same delay magnitude. In that case the frequency is substantially in accordance with the following relationship:

$$FREQUENCY = \frac{1}{DELAY}; DELAY_1 = DELAY_2 = DELAY$$

The remaining strips 7-12 of the waveforms in the FIG. 2B show the logic signals that are used to control the switches 202, 205, 210, 252, 255 and 260. The logic used to generate these signals is similar to the logic 100*c* in FIG. 1A.

Since the delay or the frequency does not depend on the comparator delay, the comparators can be made slower than normal. Thus, the power consumption of the comparators can be lowered. Also, it is easier to make a very linear voltage-controlled oscillator using the delay circuit provided by the present invention. As the speed of the comparator could be more relaxed, it is possible to make the offset of the comparator lower as well as improve the accuracy of the circuit even further. In conventional relaxation oscillators, going to higher frequency becomes increasingly challenging because of the error introduced by the comparator delays. The delay circuit provided by the present invention helps overcome this problem and allows higher frequency and more accurate design of the relaxation oscillators and analog delays.

The invention claimed is:

1. A method for calibrating a delay generation circuit comprising:

comparator based delay generator including:

a comparator to generate a delayed output signal wherein said comparator responds to an input after an intrinsic delay TPD which is a process, supply and temperature dependent parameter; and a first signal ramp produced at a controlled slope to create a predetermined time varying signal, to generate the desired delay, coupled to said comparator first input; and a predetermined reference signal coupled to said comparator first input; and a switch to select said reference, in the calibration phase, or said first signal ramp, in the delay phase, to be coupled to said comparator first input; and a second signal ramp, produced at a negative slope of said first signal ramp, coupled to said comparator second input; and a signal hold means to hold the signal level of said second signal ramp wherein after calibration said hold signal level is substantially in accordance with the following relationship to said reference, said comparator propagation delay TPD, and said first signal ramp slope S:

$$HOLD\_SIGNAL = REFERENCE - T_{PD}S$$

a logic circuit to generate the control signals.

2. The circuit according to claim 1, wherein during said calibration phase said reference is coupled to said comparator first input and said second signal ramp, starting from a value greater than said reference, is coupled to said comparator second input.

3. The circuit according to claim 2, wherein during said calibration phase said second signal ramp level, at the time instant said comparator changes its state, is maintained by said signal hold means, This will also indicate the end of said calibration phase.

4. The circuit according to claim 3, wherein during said delay phase said hold signal is coupled to said comparator second input and said first signal ramp is coupled to said comparator first input.

5. The circuit according to claim 4, wherein during said delay phase said first signal ramp is activated by an input signal event and said comparator changes its state when said first signal ramp comparison with said hold signal satisfies the comparison condition.

6. The circuit according to claim 5, wherein the delay generated from the input signal event time $T_{START}$ to said comparator state change time $T_{SC}$ is substantially in accordance with the following relationship:

$$DELAY = \int_{Tstart}^{Tsc} \frac{REFERENCE - RAMP\_START}{S} dt$$

wherein RAMP_START is the signal level of the first signal ramp at the initiation of said delay phase whereby eliminating said process, supply, temperature dependent comparator propagation delay $T_{PD}$.

7. The circuit according to claim 1, wherein said first signal ramp and said second signal ramp in one embodiment are achieved by means of a predetermined current source and a capacitor.

8. The circuit according to claim 1, wherein the means to hold said second signal ramp level is achieved by means of a capacitor.

9. An accurate relaxation oscillator circuit comprising:

two comparator based delay circuits each including:

a comparator to generate a delayed output signal wherein said comparator responds to an input after an intrinsic delay $T_{PD}$ which is a process, supply and temperature dependent parameter;

a first signal ramp produced at a controlled slope to create a predetermined time varying signal, to generate a portion of the oscillation time period, coupled to said comparator first input; and a predetermined reference signal coupled to said comparator first input; and a switch to select said reference, in the calibration phase, or said first signal ramp, in the delay phase, to be coupled to said comparator first input; and a second signal ramp, produced at a negative slope of said first signal ramp, coupled to said comparator second input; and a signal hold means to hold the signal level of said second signal ramp wherein after calibration said hold signal level is substantially in accordance with the following relationship to said reference, said comparator propagation delay $T_{PD}$ and said first signal ramp slope S:

$$\text{HOLD\_SIGNAL} = REFERENCE - T_{PD}S$$

a logic circuit that takes the output of said two delay circuits and generates the right logic signals for controlling the timing and calibration of each of the delay circuits.

10. The circuit according to claim 9, wherein said calibration phase of each said delay circuit is followed by said delay phase of that respective circuit.

11. The circuit according to claim 10, wherein the output of said first delay circuit is used as an activation signal for said first signal ramp of said second delay circuit.

12. The circuit according to claim 11, wherein the output of said second delay circuit is used as an activation signal for said first signal ramp of said first delay circuit.

13. The circuit according to claim 12, wherein said oscillator circuit sustains continuous alternate delay phases of said two delay circuits to generate a oscillation frequency substantially in accordance with the following relationship:

$$\text{FREQUENCY} = \frac{1}{\text{DELAY}_1 + \text{DELAY}_2}$$

wherein $\text{DELAY}_1$ and $\text{DELAY}_2$ are the delays generated by said two delay circuits respectively in their said delays phases whereby eliminating the dependence of the frequency on said process, supply, temperature dependent comparator propagation delay $T_{PD}$.

* * * * *